(12) United States Patent
Kurosawa et al.

(10) Patent No.: US 6,235,101 B1
(45) Date of Patent: *May 22, 2001

(54) COMPOSITION FOR FILM FORMATION AND FILM

(75) Inventors: Takahiko Kurosawa; Kinji Yamada; Tomotaka Shinoda; Minoru Matsubara; Satoko Hakamatsuka, all of Ibaraki (JP)

(73) Assignee: JSR Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,534

(22) Filed: Dec. 1, 1998

(30) Foreign Application Priority Data

Dec. 2, 1997 (JP) .................................................. 9-331449

(51) Int. Cl.$^7$ ............................. C09D 5/25; C09D 183/00
(52) U.S. Cl. ............................... 106/287.14; 106/287.15; 106/243
(58) Field of Search ..................... 106/287.14, 287.15, 106/243

(56) References Cited

U.S. PATENT DOCUMENTS 4,423,112 * 12/1983 Luthringshauser et al. ......... 428/389
4,900,362 * 2/1990 Fujiki et al. .................... 106/287.14

* cited by examiner

Primary Examiner—David Brunsman
(74) Attorney, Agent, or Firm—Oblon, Spivak, McClelland, Maier & Neustadt, P.C.

(57) ABSTRACT

A composition for film formation and a film obtained by heating the composition.

The composition comprises:

(A) a hydrolyzate and/or partial condensate of a compound represented by the following formula (1)

$$R^1_n Si(OR^2)_{4-n} \tag{1}$$

wherein $R^1$ and $R^2$ may be the same or different and each represent an alkyl group having 1 to 5 carbon atoms or an aryl group having 6 to 20 carbon atoms, and n is an integer of 1 or 2;

(B) a metal chelate compound represented by the following formula (2)

$$R^3_t M(OR^4)_{s-t} \tag{2}$$

wherein $R^3$ represents a chelating agent, M represents a metal atom, $R^4$ represents an alkyl group having 2 to 5 carbon atoms or an aryl group having 6 to 20 carbon atoms, s represents a valence of the metal M, and t is an integer of 1 to s;

(C) an organic solvent having a boiling point of 110 to 180° C.; and (D) β-diketone.

11 Claims, No Drawings

COMPOSITION FOR FILM FORMATION AND FILM

FIELD OF THE INVENTION

The present invention relates to a composition for film formation. More particularly, this invention relates to a composition for film formation which is capable of forming a coating film having a uniform thickness suitable for use as an interlayer dielectric in, e.g., semiconductor elements, and which is excellent in dielectric properties, storage stability, etc.

BACKGROUND OF THE INVENTION

Silica ($SiO_2$) films formed by vacuum processes such as CVD have conventionally been widely used frequently as interlayer dielectrics in semiconductor elements, etc. In recent years, a coating-type insulating film comprising a hydrolyzate of a tetraalkoxysilane as a main component, which is called an SOG (spin-on-glass) film has come to be used for the purpose of forming a further uniform interlayer dielectric. Furthermore, with the increase in the degree of integration in semiconductor elements and the like, an interlayer dielectric having low dielectric constant comprising an organopolysiloxane as a main component, which is called an organic SOG film has been developed.

However, further excellent electrical insulation between conductors is required for higher degree of integration in semiconductor elements and the like. Consequently, an interlayer dielectric material attaining lower dielectric constant has come to be desired.

Under these circumstances, JP-A-6-181201 (the term "JP-A" as used therein means an "unexamined published Japanese patent application") discloses as an interlayer dielectric material, a coating composition for forming an insulating film having lower dielectric constant. This coating composition has an object to provide an insulating film for semiconductor devices which has low water absorption and excellent crack resistance. This prior art coating composition for insulating film formation comprises as the main component an oligomer having a number-average molecular weight of 500 or higher, obtained by polycondensating an organometallic compound containing at least one element selected from titanium, zirconium, niobium, and tantalum with an organosilicon compound having at least one alkoxy group in the molecule.

The above JP-A reference discloses the use of methanol, ethanol, 2-propanol, THF, dioxane, diethylene glycol monomethyl ether acetate or the like as a reaction solvent used for the above coating fluid for insulating film formation and the use of 2-propanol, butyl acetate or the like as a solvent for dissolving the oligomer.

WO 96/00758 discloses a coating material for silica-based insulating film formation, comprising alkoxysilanes, alkoxides of metals other than silane, and an organic solvent, which is used for forming interlayer dielectrics of a multi-layered wiring board. This coating material makes it possible to coat in a large thickness, and is excellent in resistance to oxygen plasma ashing.

The above WO reference discloses as examples of the organic solvent used in the above coating material for insulating film formation, monohydric alcohols such as methyl alcohol, ethyl alcohol or isopropyl alcohol, and esters of those alcohols; polyhydric alcohols such as ethylene glycol or glycerol, and ethers or esters of those alcohols; and ketones such as acetone, methyl ethyl ketone, methyl isobutyl ketone or acetylacetone.

Further, JP-A-3-20377 discloses a coating liquid for oxide film formation which is useful for surface smoothing, interlayer insulation, and other purposes in electronic parts, etc. This coating liquid for oxide film formation has an object to provide a uniform coating liquid free from formation of gelled materials and also has an object to obtain a good oxide coating film free from cracks even when curing at high temperature and treatment with an oxygen plasma are conducted. This coating liquid for oxide film formation is a liquid obtained by hydrolyzing a given silane compound and a given chelate compound in the presence of an organic solvent, and polymerizing.

This JP-A reference discloses as examples of the organic solvent used for the above composition for coating film formation, methanol, ethanol, isopropyl alcohol, ethylene glycol monomethyl ether, ethylene glycol monobutyl ether, diethylene glycol monoethyl ether, diethylene glycol diethyl ether, propylene glycol monopropyl ether, dipropylene glycol monoethyl ether, ethylene glycol monomethyl ether acetate, diethylene glycol monobutyl ether acetate, ethylene glycol diacetate, N,N-dimethylacetamide, N,N-dimethylformamide, and N-methyl-2-pyrrolidone.

However, none of the conventional compositions described above can form a film having a satisfactory dielectric constant or have a well balanced combination of storage stability, adhesion to substrates, uniformity of coating film, etc.

SUMMARY OF THE INVENTION

An object of the present invention is to provide a material for interlayer dielectric formation, which has excellent balance in uniformity in coating film, dielectric properties, storage stability, adhesion to substrates, etc., by using an organic solvent having a specific boiling point and adding specific compounds thereto.

According to one embodiment of the present invention, there is provided a composition for film formation which comprises:

(A) a hydrolyzate and/or a partial condensate of a compound represented by the following formula (1)

$$R^1_n Si(OR^2)_{4-n} \qquad (1)$$

wherein $R^1$ and $R^2$ may be the same or different and each represent an alkyl group having 1 to 5 carbon atoms or an aryl group having 6 to 20 carbon atoms, and n is an integer of 1 or 2, (B) a metal chelate compound represented by the following formula (2)

$$R^3_t M(OR^4)_{s-t} \qquad (2)$$

wherein $R^3$ represents a chelating agent, M represents a metal atom, $R^4$ represents an alkyl group having 2 to 5 carbon atoms or an aryl group having 6 to 20 carbon atoms, s represents a valence of the metal M, and t is an integer of 1 to s;

(C) an organic solvent having a boiling point of 110 to 180° C.; and (D) β-diketone.

According to another embodiment of the present invention, there is provided a film obtained by heating the composition.

DETAILED DESCRIPTION OF THE INVENTION

Each component of the composition of the present invention will be described below.

Component (A):

In the above formula (I), examples of the alkyl group having 1 to 5 carbon atoms represented by $R^1$ or $R^2$ include methyl, ethyl, propyl and butyl, and examples of the aryl group having 6 to 20 carbon atoms represented by $R^1$ or $R^2$ include phenyl, tolyl, xylyl and naphthyl.

Specific examples of the compound represented by the formula (1) include methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butylisotriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, t-butyltrimethoxysilane, t-butyltriethoxysilane, t-butyltri-n-propoxysilane, t-butyltriisopropoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, dimethyidimethoxysilane, dimethyidiethoxysilane, dimethyidi-n-propoxysilane, dimethyldiisopropoxysilane, dimethyidi-n-butoxysilane, dimethyidi-sec-butoxysilane, dimethyldi-tert-butoxysilane, dimethyldiphenoxysilane, diethyidimethoxysilane, diethyldiethoxysilane, diethyidi-n-propoxysilane, diethyidiisopropoxysilane, diethyldi-n-butoxysilane, diethyidi-sec-butoxysilane, diethyidi-tert-butoxysilane, diethyidiphenoxysilane, di-n-propyidimethoxysilane, di-n-propyldiethoxysilane, di-n-propyidi-n-propoxysilane, di-n-propyidiisopropoxysilane, di-n-propyidi-n-butoxysilane, di-n-propyldi-sec-butoxysilane, di-n-propyidi-tert-butoxysilane, di-n-propyldiphenoxysilane, diisopropyidimethoxysilane, diisopropyidiethoxysilane, diisopropyldi-n-propoxysilane, diisopropyldiisopropoxysilane, diisopropyldi-n-butoxysilane, diisopropyidi-sec-butoxysilane, diisopropyldi-tert-butoxysilane, diisopropyidiphenoxysilane, di-n-butyldimethoxysilane, di-n-butyidiethoxysilane, di-n-butyidi-n-propoxysilane, di-n-butyldiisopropoxysilane, di-n-butyidi-n-butoxysilane, di-n-butyldi-sec-butoxysilane, di-n-butyidi-tert-butoxysilane, di-n-butyidiphenoxysilane, di-sec-butyldimethoxysilane, di-sec-butyidiethoxysilane, di-sec-butyldi-n-propoxysilane, di-sec-butyidiisopropoxysilane, di-sec-butyidi-n-butoxysilane, di-sec-butyldi-sec-butoxysilane, di-sec-butyidi-tert-butoxysilane, di-sec-butyldiphenoxysilane, di-tert-butyldimethoxysilane, di-tert-butyidiethoxysilane, di-tert-butyldi-n-propoxysilane, di-tert-butyidiiso-propoxysilane, di-tert-butyldi-n-butoxysilane, di-tert-butyidi-sec-butoxysilane, di-tert-butyidi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphernyldiphenoxysilane, divinyldimethoxysilane, γ-aminopropyltrimethoxysilane, γ-aminopropyltri-ethoxysilane, γ-glycidoxypropyltrimethoxysilane, γ-glycidoxypropyltrethoxysilane, γ-trifluoropropyltrimethoxysilane and γ-trifluoropropyltriethoxysilane. Those alkylalkoxysilanes may be used alone or in combination of two or more thereof.

Of the compound represented by the formula (1), It is preferred in the composition for film formation of the present invention to use alkyltrialkoxysilanes wherein n=1. More preferred are methyltrimethoxysilane, methyltriethoxysilane, phenyltrimethoxysilane and phenyl-triethoxysilane. The most preferred is to use at least either of methyltrimethoxysilane and methyltriethoxysilane in an amount of at least 70 mol % to —OR' group. Using alkylalkoxysilanes in such a proportion is preferred in that a film-forming composition giving a cured film having higher heat resistance is obtained.

In subjecting the compound represented by the formula (1) to hydrolysis and further partial condensation, water is preferably used in an amount of 0.3 to 1.2 mols, and preferably 0.3 to 1.0 mol, per mole of the OR-groups.

The reason for this is that if the amount of water added is in the range of from 0.3 to 1.2 mols, there is no possibility to decrease uniformity of the coating film and also there is less possibility that storage stability of the composition for film formation lowers.

Component (B):

Examples of M in the formula (2) include titanium, zirconium, aluminum, tin and zinc. Of those, titanium, zirconium and aluminum are preferably used, and titanium and zirconium are more preferably used.

Examples of the chelate represented by $R^3$ in the formula (2) include β-diketones and β-ketoesters. Specific examples thereof include acetylacetone, methyl acetoacetate, ethyl acetoacetate, n-propyl acetoacetate, isopropyl acetoacetate, n-butyl acetoacetate, sec-butyl acetoacetate, t-butyl acetoacetate, 2,4-hexanedione, 2,4-heptanedione, 3,5-heptanedione, 2,4-octanedione, 2,4-nonanedione and 5-methylhexanedione.

Specific examples of the metal chelate represented by the formula (2) include:

titanium chelate compounds such as triethoxymono(acetylacetonato)titanium, tri-n-propoxymono(acetylacetonato)titanium, triisopropoxymono(acetylacetonato)titanium, tri-n-butoxymono(acetylacetonato)titanium, tri-sec-butoxymono(acetylacetonato)titanium, tri-t-butoxymono(acetylacetonato)-titanium, diethoxybis(acetylacetonato)fitanium, di-n-propoxybis(acetylacetonato)titanium, diisopropoxybis(acetylacetonato)titanium, di-n-butoxybis(acetylacetonato)titanium, di-sec-butoxybis(acetylacetonato)titanium, di-t-butoxybis(acetylacetonato)titanium, monoethoxytris(acetylacetonato)-titanium, mono-n-propoxytris(acetylacetonato)titanium, monoisopropoxytris-(acetylacetonato)titanium, mono-n-butoxytris(acetylacetonato)titanium, mono-sec-butoxyris(acetylacetonato)titanium, mono-t-butoxytris(acetylacetonato)-titanium, tetrakis(acetylacetonato)

titanium, triethoxymono(ethylacetoacetato)-titanium, tri-n-propoxymono(ethylacetoacetato)titanium, triisopropoxymono-(ethylacetoacetato)titanium, tri-n-butoxymono(ethylacetoacetato)titanium, tri-sec-butoxymono(ethylacetoacetato)titanium, tri-t-butoxymono(ethyl-acetoacetato)titanium, diethoxybis(ethylacetoacetato)titanium, di-n-propoxybis(ethylacetoacetato)titanium, diisopropoxybis(ethylacetoacetato)-titanium, di-n-butoxybis(ethylacetoacetato)btanium, di-sec-butoxybis-(ethylacetoacetato)titanium, di-t-butoxybis(ethylacetoacetato)titanium, monoethoxytris(ethylacetoacetato)titanium, mono-n-propoxytris(ethyl-acetoacetato)titanium, monoisopropoxytris(ethylacetoacetato)titanium, mono-n-butoxytris(ethylacetoacetato)titanium, mono-sec-butoxytris(ethyl-acetoacetato)titanium, mono-t-butoxytris(ethylacetoacetato) titanium, tetrakis(ethylacetoacetato)titanium, mono(acetylacetonato)tris(ethyl-acetoacetato)titanium, bis(acetylacetonato)bis(ethylacetoacetato)titanium, and tris(acetylacetonato)mono(ethylacetoacetato)titanium; and zirconium chelate compounds such as triethoxymono(acetylacetonato)zirconium, tri-n-propoxymono(acetylacetonato)zirconium, triisopropoxymono(acetyl-acetonato)zirconium, tri-n-butoxymono(acetylacetonato) zirconium, tri-sec-butoxymono(acetylacetonato)zirconium, tri-t-butoxymono(acetyl-acetonato)zirconium, diethoxybis(acetylacetonato)zirconium, di-n-propoxybis(acetylacetonato)zirconium, diisopropoxybis(acetylacetonato)-zirconium, di-n-butoxybis(acetylacetonato)zirconium, di-sec-butoxybis-(acetylacetonato)zirconium, di-t-butoxybis(acetylacetonato) zirconium, monoethoxytris(acetylacetonato)zirconium, mono-n-propoxytris(acetyl-acetonato)zirconium, monoisopropoxytris(acetylacetonato)zirconium, mono-n-butoxytris(acetylacetonato)zirconium, mono-sec-butoxytris(acetyl-acetonato)zirconium, mono-t-butoxytris(acetylacetonato)zirconium, tetrakis(acetylacetonato)zirconium, triethoxymono(ethylacetoacetato) zirconium, tri-n-propoxymono(ethylacetoacetato)zirconium, triisopropoxymono(ethyl-acetoacetato)zirconium, tri-n-butoxymono(ethylacetoacetato)zirconium, tri-sec-tri-t-butoxymono(ethyl-acetoacetato)zirconium, diethoxybis(ethylacetoacetato)zirconium, di-n-propoxybis(ethylacetoacetato)zirconium, diisopropoxybis(ethylacetoacetato)-zirconium, di-n-butoxybis(ethylacetoacetato)zirconium, di-sec-butoxybis(ethylacetoacetato)zirconium, di-t-butoxybis(ethylacetoacetato)-zirconium, monoethoxytris(ethylacetoacetato)zirconium, mono-n-propoxytris-(ethylacetoacetato)zirconium, monoisopropoxytris(ethylacetoacetato)zirconium, mono-n-butoxytris(ethylacetoacetato)zirconium, mono-sec-butoxytris(ethyl-acetoacetato)zirconium, mono-t-butoxytris(ethylacetoacetato)zirconium, tetrakis(ethylacetoacetato)zirconium, mono(acetylacetonato)tris(ethyl-acetoacetato)zirconium, bis(acetylacetonato)bis(ethylacetoacetato)zirconium, and tris(acetylacetonato)mono(ethylacetoacetato)zirconium.

These metal chelate compounds may be used alone or in combination of two or more thereof.

Of the compounds represented by the formula (2), compounds having the following structures are preferable.

$(CH_3(CH_3)HCO)_{4-t}Ti(CH_3COCH_2COCH_3)_t$
$(CH_3(CH_3)HCO)_{4-t}Ti(CH_3COCH_2COOC_2H_5)_t$
$(C_4H_9O)_{4-t}Ti(CH_3COCH_2COCH_3)_t$
$(C_4H_9O)_{4-t}Ti(CH_3COCH_2COOC_2H_5)_t$
$(C_2H_5(CH_3)CO)_{4-t}Ti(CH_3COCH_2COCH_3)_t$
$(C_2H_5(CH_3)CO)_{4-t}Ti(CH_3COCH_2COOC_2H_5)_t$
$(CH_3(CH_3)HCO)_{4-t}Zr(CH_3COCH_2COCH_3)_t$
$(CH_3(CH_3)HCO)_{4-t}Zr(CH_3COCH_2COOC_2H_5)_t$
$(C_4H_9O)_{4-t}Zr(CH_3COCH_2COCH_3)_t$
$(C_4H_9O)_{4-t}Zr(CH_3COCH_2COOC_2H_5)_t$
$(C_2H_5(CH_3)CO)_{4-t}Zr(CH_3COCH_2COCH_3)_t$
$(C_2H_5(CH_3)CO)_{4-t}Zr(CH_3COCH_2COOC_2H_5)_t$
$(CH_3(CH_3)HCO)_{3-t}Al(CH_3COCH_2COCH_3)_t$
$(CH_3(CH_3)HCO)_{3-t}Al(CH_3COCH_2COOC_2H_5)_t$
$(C_4H_9O)_{3-t}Al(CH_3COCH_2COCH_3)_t$
$(C_4H_9O)_{3-t}Al(CH_3COCH_2COOC_2H_5)_t$
$(C_2H_5(CH_3)CO)_{3-t}Al(CH_3COCH_2COCH_3)_t$
$(C_2H_5(CH_3)CO)_{3-t}Al(CH_3COCH_2COOC_2H_5)_t$

The amount of the metal chelate compound represented by the formula (2) used is generally 0.5 to 300 mmol, preferably 0.5 to 200 mmol, and more preferably from 1 to 100 mmol, per 100 parts by weight of the hydrolyzate and/or partial condensate of the compound represented by the formula (1).

The reason for this is that if the metal chelate compound represented by the formula (2) is used in an amount within the range of from 0.5 to 300 mmol, the composition can give a cured coating film having a uniform thickness and a low dielectric constant.

Component (C):

The organic solvent used in the present invention has a boiling point of 110 to 180° C.

Examples of the organic solvent having a boiling point of 110 to 180° C. include ethyl lactate, methoxymethyl propionate, ethoxyethyl propionate, methyl amyl ketone, propylene glycol methyl ether acetate, propylene glycol monopropyl ether, propylene glycol monoethyl ether and propylene glycol monomethyl ether.

Those organic solvents are used in an amount of 20 to 4,000 parts by weight, and preferably 100 to 2,000 parts by weight, per 100 parts by weight of component (A). The organic solvent used in the present invention may contain less than 20% by weight of a solvent having a boiling point of lower than 110° C.

Component (D):

Examples of β-diketones usable in the present invention include acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione. Those β-diketones may be used alone or in combination of two or more thereof.

The β-diketone content in the composition for film formation of the present invention is preferably 1 to 50% by weight based on the weight of the organic solvent having a boiling point of 40 to 180° C.

Component (D) of the present invention is added separately from the β-diketone which constitutes the metal chelate of component (B).

The composition of the present invention may contain a tetrafunctional alkoxysilane represented by the following formula (3):

$$Si(OR^5)_4 \qquad (3)$$

wherein $R^5$ represents an alkyl group having 1 to 5 carbon atoms or an aryl group having 6 to 20 carbon atoms.

Incorporation of such a tetrafunctional alkoxysilane can further improve resistance to oxygen plasma ashing of the composition for film formation.

Examples of the tetrafunctional alkoxysilane represented by the formula (3) include tetramethoxysilane, tetraethoxysilane, tetra-n-propoxysilane, tetraisopropoxysilane, tetra-n-butoxysilane, tetra-sec-butoxysilane, tetra-tert-butoxysilane and tetraphenoxysilane. Those tetrafunctional alkoxysilanes may be used alone or in combination of two or more thereof.

Where the tetrafunctional compound represented by the formula (3) is used, the amount thereof is preferably 0.1 to 50 parts by weight per 100 parts by weight of the hydrolyzate and/or partial condensate of the compound represented by the formula (1).

The reason for this is that if the tetrafunctional compound represented by the formula (3) is used in an amount within the above-described range, there is no possibility that cracks generate in the coating film after curing, and also reactivity of the composition for film formation can be improved.

Therefore, from the standpoint of a better balance between the prevention of generation of cracks in the coating film and the improvement of reactivity in the composition for film formation, the amount of the tetrafunctional compound represented by the formula (3) used is more preferably 0.1 to 30 parts by weight per 100 parts by weight of the hydrolyzate and/or partial condensate of the compound represented by the formula (1).

The reason for this is that if the tetrafunctional compound is added in an amount within the above-described range, a certain degree of storage stability can be obtained and there is less possibility that properties, e.g., heat resistance, of the composition for film formation lower.

Besides components (A) to (D) described above, the composition of the present invention may further contain an organic carboxylic acid and/or a carboxylic acid anhydride.

Examples of the organic carboxylic acid include carboxylic acids represented by RCOOH (wherein R represents a hydrogen atom or an alkyl group having 1 to 16 carbon atoms), lactic acid, tartaric acid, malonic acid, oxalic acid, succinic acid, glutarc acid, adipic acid, pimelic acid, suberic acid, maleic acid, phthalic acid, fumaric acid and benzoic add. Those carboxylic acids may be used alone or in combination of two or more thereof.

Preferred examples of the carboxylic acid anhydride are anhydrides of the above-described carboxylic acids. Those carboxylic acid anhydrides may be used alone or in combination of two or more thereof.

It is preferable in the composition for film formation of the present invention that sodium content is 20 ppb or less.

The composition for film formation of the present invention is coated on a substrate by conventional methods. Drying of the coating film can be conducted heating the same at a temperature of 300 to 500° C. in air or an atmosphere containing 0 to 20% oxygen.

By limiting the sodium content to a value within the above range, the composition even when used as a material for forming interlayer dielectrics for semiconductors, etc., can form interlayer dielectrics having a uniform thickness while more efficiently preventing generation of the corrosion of electric circuits, etc.

The composition for film formation of the present invention can form a coating film having a uniform thickness and also has a low dielectric constant. Therefore, the composition of the present invention is advantageously used as a material for forming an interlayer dielectric.

The present invention will be described in more detail by reference to the following Examples. However, the following Examples are a description for showing general embodiments of the present invention, and the invention should not be construed as being limited by the following description without particular reasons.

In the following Examples and Comparative Examples, all "parts" and "percents" are by weight unless otherwise indicated.

EXAMPLE 1

Preparation of Composition for Film Formation:

203 Parts of methyltrimethoxysilane (MTMSi) (100 parts in terms of condensate) was mixed with 0.7 part (1.3 mmol) of diisopropoxytitanium-bisethylacetylacetate (DIPTEiAA), 600 parts of methoxymethyl propionate (MMP), and 40 parts of ion-exchanged water (corresponding to 0.5 mol per mole of the methoxy groups of the MTMSi). The resulting mixture was reacted at 60° C. for 10 hours while stirring with a stirrer. 84 Parts (46.3 mmol) of acetylacetone was then added thereto. After adding acetylacetone, methanol was removed from the resulting mixture at 40° C. under reduced pressure to obtain a composition for film formation. The composition of this composition for film formation is shown in Table 1.

Evaluation of the Composition for Film Formation:

1. Uniformity of Coating Film

The composition for film formation prepared above was coated on a 4-inch silicon wafer with a spin coater under the conditions of a rotational speed of 1,000 rpm and 10 seconds. The silicon wafer having the composition for film formation coated thereon was heated with a hot plate held at 80° C. for 5 minutes to thereby volatilize an organic solvent.

The silicon wafer having the composition for film formation coated thereon was heated with a hot plate held at 200° C. for 5 minutes, and then further heated with a vacuum oven held at 450° C. (degree of vacuum≦1 Torr) for 60 minutes to cure the coating film formed on the silicon wafer.

The appearance of the thus-obtained coating film was visually examined, and the surface roughness ($R_a$) of the coating film was measured with a tracer-method surface roughness meter (Dektak 3030, manufactured by ULVAC Corp.). From the results of the appearance of coating film and the found value of surface roughness ($R_a$), the uniformity of the coating film was evaluated based on the following criteria. The evaluation results obtained are shown in Table 1.

O: Appearance with no cissing or unevenness, and a surface roughness ($R_a$) of lower than 200 Å.

Δ: Appearance with no cissing or unevenness, and a surface roughness ($R_a$) of 200 Å; or larger.

x: Appearance with cissing or unevenness.

2. Adhesion Test

The same type of the coating film as used in the above appearance examination was subjected to a wet heat treatment using a PCT (pressure cooker test) apparatus (PC-242HS-A, manufactured by Hirayama Seisakusho K. K.) under the conditions of 121° C., 100% RH, and 2 atm. The coating film which had undergone the wet heat treatment was then subjected to a crosscut tape test (tape peeling test) in accordance with JIS K5400.

The same test was repeatedly conducted three times. For each test, the number of squares remaining adhered to the silicon wafer as a substrate in the 100 squares was counted. The average value (n) of the thus-obtained three numbers was calculated to evaluate adhesion of the coating film to the substrate. The results obtained are shown in Table 1.

O: n is 100.

Δ: n is 50 or larger.

x: n is below 50.

3. Dielectric Constant

An aluminum-sputtered silicon wafer on which a TiN layer had been laminated as a cover metal was spin-coated with the above-described composition for film formation using a spinner. The silicon wafer having the composition for film formation coated thereon was heated with a hot plate held at 80° C. for 5 minutes to thereby volatilize an organic solvent. The silicon wafer having the composition for film formation coated thereon was heated with a hot plate held at 200° C. for 5 minutes, and then further heated with a vacuum oven held at 450° C. (degree of vacuum≦1 Torr) for 60 minutes to cure the composition for film formation.

Dielectric constant of the coating film obtained was measured at a high frequency of 1 MHz using electrode HP16451 B and precision LCR meter HP4284A, both manufactured by Yokokawa-Hewlet Packard Co., Ltd. The results obtained are shown in Table 2.

4. Heat Resistance

The composition for film formation was placed on an aluminum pan. The aluminum having the composition for film formation placed thereon was heated with a hot plate held at 80° C. for 5 minutes to thereby volatilize an organic solvent. The aluminum pan was heated with a hot plate held at 200° C. for 5 minutes, and then further heated with a vacuum oven held at 450° C. (degree of vacuum≦1 Torr) for 60 minutes to cure the composition for film formation.

The film thus obtained was heated with thermogravimetric analyzer (TGA) SSC5200, manufactured by Seiko Instruments Inc., in a nitrogen atmosphere at a heating rate of 10° C./min to determine a 5% weight loss temperature of the film. The results of the measurement are shown in Table 2.

5. Storage Stability

The composition for film formation obtained was stored at 25° C. for 3 months, and then examined for any change. The results obtained are shown in Table 2.

O: No change
Δ: Viscosity increased
x: Gelled

EXAMPLES 2 TO 11 AND COMPARATIVE EXAMPLES 1 TO 6

Preparation of Compositions for Film Formation:

Compositions for film formation were prepared in the same manner as in Example 1, except that the kinds and amounts of the silane compound, chelating agent, organic solvent, additives and reaction time were changed as shown in Table 1.

EXAMPLE 12

Preparation of Composition for Film Formation:

203 Parts of methyltrimethoxysilane (MTMSi) (100 parts in terms of condensate) was mixed with 0.7 part (concentration: 77.9%) (1.3 mmol) of diisopropoxytitanium-bisethylacetylacetate (DIPTiEAA), 200 parts of PFG, and 40 parts of ion-exchanged water (corresponding to 0.5 mol per mole of the methoxy groups of the methyltrimethoxysilane). The resulting mixture was reacted at 60° C. for 4 hours while stirring with a stirrer. 22 Parts acetylacetone and 120 parts of PFG were then added thereto. Methanol was then removed at 40° C. under reduced pressure to obtain a composition for film formation. The composition of this composition for film formation is shown in Table 1.

EXAMPLE 13

A composition for film formation was prepared in the same manner as in Example 1, except that the further heating the silicon wafer having the composition for film formation coated thereon at 450° C. for 60 minutes was conducted in air.

EXAMPLE 14

A composition for film formation was prepared in the same manner as in Example 1, except that the further heating the silicon wafer having the composition for film formation coated thereon at 450° C. for 60 minutes was conducted in a nitrogen atmosphere having an oxygen concentration of 20 ppm.

Evaluation of the Compositions for Film Formation:

Each composition was evaluated for thickness uniformity, adhesion, dielectric constant, and heat resistance of a coating film under the same conditions as in Example 1. The results obtained are shown in Table 2.

TABLE 1-1

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| MTMSi | 203 | 203 | 203 | 177 | 203 | 152 | 203 | 203 | 203 | 203 | 183 | 203 |
| PhTMSi | | | | 20 | | 38 | | | | | | |
| TMOS | | | | | | | | | | | 25 | |
| TEOS | | | | | | | | | | | | |
| DIPTiEAA | 7 | 7 | 50 | 2.7 | | | STET | 7 | | | | 0.7 |
| TBZrEAA | | | | | 16 | 5.7 | | | STET | | | |
| DIPAIEAA | | | | | | | | | | 0.7 | | |
| Ion-exchanged water | 40 | 40 | 40 | 45 | 35 | 35 | 40 | 40 | 40 | 40 | 40 | 40 |
| MMP | 600 | 500 | | | | | | | | | | |
| EtEP | | | 700 | | | | | | | | | |
| Ethyl lactate | | | | 500 | | 100 | | | | | | |
| MAK | | | | | | 100 | | | | | | |
| PGMEA | | | | | 700 | 100 | | | | | | |
| PFG | | | | | | | 300 | 500 | 250 | 250 | 500 | 200 1120*) |
| AcAc | 84 | 150 | 298 | 27 | 96 | 37 | 27 | 38 | 25 | 50 | 76 | 22 |
| Reaction time (hr) | 10 | 2 | 2 | 4 | 4 | 6 | 10 | 4 | 14 | 14 | 2 | 4 |

*): After completion of the reaction, adding before removal of methanol.
TBZrEAA: monobutoxyzirconium trisethylacetoacetate
DIPAIEAA: Diisopropoxyalumiunum ethylacetoacetate

TABLE 1-2

| | Comparative Example | | | | | |
|---|---|---|---|---|---|---|
| | 1 | 2 | 3 | 4 | 5 | 6 |
| MTMSi | 203 | 203 | 203 | 203 | 203 | 203 |
| PhTMSi | | | | | | |
| TMOS | | | | | | |
| TEOS | | | | | | |
| DIPTiEAA | | 36.5 | 36.5 | | 0.6 | 0.6 |
| NBTiAA | | | | | | |
| TBZrEAA | | | | | | |
| Aluminum chelate | | | | | | |
| Ion-exchanged water | 40 | 40 | 40 | 40 | 32 | 32 |
| MMP | 800 | | | 800 | | 20 |
| EtEP | | | | | | |
| Ethyl lactate | | | | | | |
| MAK | | | | | | |
| PGMEA | | | | | | |
| PFG | | | | | 20 | |
| IP | | 800 | | | | |
| NMP | | | 800 | | | |
| HNO₃ | | | | | 10 | |
| AcAc | | | | | | |

TABLE 2-1

| | Example | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Uniformity of coating film | ○ | ○ | ○ | ○ | ○ | ○ | ○ | ○ | ○ | ○ | ○ | ○ | ○ | ○ |
| Storage stability | ○ | ○ | ○ | ○ | ○ | ○ | ○ | ○ | ○ | ○ | ○ | ○ | — | — |
| Adhesion | ○ | ○ | ○ | ○ | ○ | ○ | ○ | ○ | ○ | ○ | ○ | ○ | ○ | ○ |
| Dielectric constant | 2.4 | 2.6 | 2.8 | 2.5 | 2.6 | 2.5 | 2.4 | 2.6 | 2.4 | 2.4 | 2.6 | 2.4 | 2.5 | 2.4 |
| Heat resistance (° C.) | >600 | >600 | >600 | >600 | >600 | >600 | >600 | >600 | >600 | >600 | >600 | >600 | >600 | >600 |

TABLE 2-2

| | Comparative Example | | | | | |
|---|---|---|---|---|---|---|
| | 1 | 2 | 3 | 4 | 5 | 6 |
| Uniformity of coating film | X | Δ | X | ○ | Δ | Δ |
| Storage stability | ND | Δ | X | X | Δ | X |
| Adhesion | ND | ○ | ND | ○ | ○ | ○ |
| Dielectric constant (—) | ND | ND | ND | 2.8 | ND | ND |
| Heat resistance (° C.) | >600 | >600 | >600 | >600 | >600 | >600 |

A hydrolyzate and/or partial condensate of an organoalkoxysilane, a metal chelate compound, and a specific organic solvent are used as components to constitute a composition for film formation, and such a constitution makes it possible to provide a composition for film formation (material for interlayer dielectrics) having an excellent balance among uniformity in thickness of a coating film, dielectric properties, adhesion to substrates, storage stability and the like.

Further, by limiting a sodium content in the composition for film formation to a given value or less, the composition even when used as a material for forming interlayer dielectrics for semiconductors, etc., can form interlayer dielectrics having a uniform thickness while more efficiently preventing generation of the corrosion of electric circuits, etc.

While the invention has been described in detail and with reference to specific embodiments thereof, it will be apparent to one skilled in the art that various changes and modifications can be made therein without departing from the spirit and scope thereof.

What is claimed is:

1. A composition for film formation which comprises:

(A) a hydrolyzate and/or partial condensate of a compound represented by the following formula (1)

$$R^1_n Si(OR^2)_{4-n} \quad (1)$$

wherein $R^1$ and $R^2$ may be the same or different and each represent an alkyl group having 1 to 5 carbon atoms or an aryl group having 6 to 20 carbon atoms, and n is an integer of 1 or 2;

(B) a metal chelate compound represented by the following formula (2)

$$R^3_t M(OR^4)_{s-t} \quad (2)$$

wherein $R^3$ represents a chelating agent, M represents a metal atom, $R^4$ represents an alkyl group having 2 to 5 carbon atoms or an aryl group having 6 to 20 carbon atoms, s represents a valence of the metal M, and t is an integer of 1 to s;

(C) an organic solvent having a boiling point of 110 to 180° C.; and (D) β-diketone.

2. The composition as claimed in claim 1, wherein M in the formula (2) is at least one member selected from the group consisting of titanium, zirconium and aluminum.

3. The composition as claimed in claim 1, wherein the organic solvent having a boiling point of 110 to 180° C. is at least one member selected from the group consisting of ethyl lactate, methoxymethyl propionate, ethoxyethyl propionate, methyl amyl ketone, propylene glycol methyl ether acetate and propylene glycol monoalkyl ethers.

4. The composition as claimed in claim 1, wherein the β-diketone is at least one member selected from the group consisting of acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl3,5-heptanedione and 1,1,1,5,5-hexafluoro-2,4-heptanedione.

5. The composition as claimed in claim 1, wherein the β-diketone is present in an amount of 0.5 to 20 mols per mole of the metal chelate compound.

6. A film obtained by heating a composition for film formation which comprises:

(A) a hydrolyzate and/or partial condensate of a compound represented by the following formula (1)

$$R^1{}_n Si(OR^2)_{4-n} \quad (1)$$

wherein $R^1$ and $R^2$ may be the same or different and each represent an alkyl group having 1 to 5 carbon atoms or an aryl group having 6 to 20 carbon atoms, and n is an integer of 1 or 2;

(B) a metal chelate compound represented by the following formula (2)

$$R^3{}_t M(OR^4)_{s-t} \quad (2)$$

wherein $R^3$ represents a chelating agent, M represents a metal atom, $R^4$ represents an alkyl group having 2 to 5 carbon atoms or an aryl group having 6 to 20 carbon atoms, s represents a valence of the metal M, and t is an integer of 1 to s;

(C) an organic solvent having a boiling point of 110 to 180° C.; and (D) β-diketone.

7. The composition as claimed in claim 1, which further comprises at least one tetrafunctional silane represented by the following formula (3):

$$Si(OR^5)_4 \quad (3)$$

wherein $R^5$ represents an alkyl group having 1 to 5 carbon atoms or an aryl group having 6 to 20 atoms.

8. The composition as claimed in claim 7, wherein the tetrafunctional silane is present in an amount of 0.1 to 50 parts by weight per 100 parts by weight of the compound of formula (1).

9. The composition as claimed in claim 1, which further comprises at least one organic carboxylic acid or anhydride thereof.

10. The composition as claimed in claim 9, wherein the carboxylic acid is of the formula RCOOH where R represents hydrogen, an alkyl group of 1 to 16 carbon atoms or phenyl.

11. The composition as claimed in claim 1, wherein the sodium content is 20 ppb or less.

* * * * *